United States Patent [19]
McClure

[11] Patent Number: 5,745,420
[45] Date of Patent: Apr. 28, 1998

[54] INTEGRATED MEMORY CIRCUIT WITH SEQUENCED BITLINES FOR STRESS TEST

[75] Inventor: David C. McClure, Carrollton, Tex.

[73] Assignee: SGS-Thomson Microelectronics, Inc., Carrollton, Tex.

[21] Appl. No.: 833,582

[22] Filed: Apr. 7, 1997

Related U.S. Application Data

[63] Continuation of Ser. No. 509,196, Jul. 31, 1995, abandoned.
[51] Int. Cl.[6] .................................................. G11C 7/00
[52] U.S. Cl. ...................................... 365/201; 365/69
[58] Field of Search ............................................. 365/201

[56] References Cited

U.S. PATENT DOCUMENTS

| | | | |
|---|---|---|---|
| 4,796,234 | 1/1989 | Itoh | 365/149 |
| 4,916,661 | 4/1990 | Nawaki | 365/51 |
| 4,922,459 | 5/1990 | Hidaka | 365/206 |
| 4,977,542 | 12/1990 | Matsuda | 365/207 |
| 4,980,860 | 12/1990 | Houston et al. | 365/189.11 |
| 5,241,500 | 8/1993 | Barth, Jr. | 365/189.01 |
| 5,299,164 | 3/1994 | Takeuchi | 365/201 |
| 5,325,337 | 6/1994 | Buttar | 365/201 |
| 5,339,277 | 8/1994 | McClure | 365/230.08 |
| 5,341,336 | 8/1994 | McClure | 365/201 |
| 5,367,492 | 11/1994 | Kawamoto | 365/201 |

*Primary Examiner*—David C. Nelms
*Assistant Examiner*—Michael T. Tran
*Attorney, Agent, or Firm*—David V. Carlson; Theodore E. Galanthay; Lisa K. Jorgenson

[57] ABSTRACT

An integrated circuit having a memory array comprised of a plurality of memory cells arranged in rows and columns and a logic circuitry including column decoder and read/write circuitry, wherein each column includes a plurality of memory cells connected in parallel by way of a pair of true and complement bitlines extending from the memory array to the logic circuitry. In order to perform a complete voltage stress test of the memory array, inside the array true and complement bitlines are alternated so that every true bitline is adjacent exclusively to complement bitlines and every complement bitline is adjacent exclusively to true bitlines. According to a first embodiment of the invention, bitlines exiting from the memory array are connected directly to the logic circuitry, while according to a second embodiment, between the array and the logic circuitry, at least one pair of true and complement bitlines is twisted so that one bitline cross over the other. As a result, inside the memory array the true bitline of said at least one pair is adjacent exclusively to complement bitlines and the complement bitline of said at least one pair is adjacent exclusively to true bitlines.

20 Claims, 4 Drawing Sheets

INTEGRATED MEMORY CIRCUIT WITH SEQUENCED BITLINES FOR STRESS TEST

CROSS-REFERENCE TO PRIOR APPLICATION

This application is a continuation of U.S. patent application Ser. No. 08/509,196, filed Jul. 31, 1995, now abandoned.

BACKGROUND OF THE INVENTION

1. Field of the Invention

The present invention relates to the testing of memory devices and more particularly to the testing of static random access memory (SRAM) devices, first-in first-out (FIFO) memory devices, and other memories incorporated in integrated circuits.

2. Description of the Prior Art

The premature or infant failure of memory cells in integrated SRAMs, multiple port memories, FIFO memories and other memory products has been an unfortunate but all too common occurrence. Moreover, failure of such parts in the field is unacceptable to vendors of products incorporating integrated circuit memory. As a result, nondestructive testing of all integrated circuits to expose and detect that integrated circuits subject to infant failure is dictated by the market.

One contemporary testing regimen places memory devices into a burn in oven, elevates the device temperature, and then exercises these devices, often with stress voltages applied to the product. For some large capacity memory devices the period in the burn in oven has reached as much as 96 hours, in order to stress each of over one thousand wordlines and millions of memory cells. Such long burn-in cycles pose an obvious bottleneck to production, and are useless for generating up to the minute information about possible faults in the manufacturing process. An accelerated stress mode that eliminates this bottleneck without damaging good memory product would have apparent benefits.

For some test or operating modes of the memory array, selection of all or a portion of row and/or bit lines at a single time is desirable. An example of a test mode where selecting all or a portion of the row and bit lines at a single time is used is described in co-pending U.S. patent application Ser. No. 07/954,276, entitled Stress Test For Memory Arrays In Integrated Circuits, filed Sep. 30, 1992, assigned to SGS THOMSON Microelectronics, Inc. and incorporated herein by this reference. A plurality of rows is selected at one time and a stress voltage is placed on a plurality of bit and complementary bit lines. In this manner the memory cells within the memory array are stress tested in order to detect latent defects.

Another example of test mode where selecting all the row and bit lines at a single time is used is described in U.S. Pat. No. 5,341,336 entitled Method For Stress Testing Decoders And Periphery Circuits, assigned to SGS THOMSON Microelectronics, Inc. and incorporated herein by this reference. A plurality of rows and bit lines are selected or deselected simultaneously and a stress voltage is applied to the integrated circuit. In this manner latent defects within decoders and periphery circuits can be detected.

A circuit that allows for the simultaneous selection or deselection of a plurality of rows and columns within a memory array is described in U.S. Pat. No. 5,339,277 entitled Address Buffer, assigned to SGS THOMSON Microelectronics, Inc. and incorporated herein by this reference. A first and a second circuit generate a true and a complementary signal, respectively, during normal operations of the integrated circuit. When desired the first and second circuits may be used to generate two signals of the same voltage level. The two signals of the same voltage level may then be used by an address decoder to simultaneously select or deselect a plurality of rows and/or columns within a memory array.

FIG. 1 illustrates part of a static random access memory (SRAM) circuit of conventional architecture, having its memory cells in the memory array 1. In particular, the memory array 1 is connected, through a plurality of bitlines 18–29, to a circuit block 8 containing column decoder 9 and read/write circuitry.

Memory cells in array 1 are arranged in rows and columns. It should be noted that the designation of rows and columns in array 1 use the term row to refer to the array direction in which a plurality of memory cells are selected by way of a wordline (WL) In conventional memories, each of the memory cells in the selected row are generally coupled to a complementary pair of bitlines (T for a true bitline and C for a complement bitline) The term column is used in this description to refer to the array direction in which one or more of the memory cells in the selected row are selected for read or write access. In conventional memories, this is generally accomplished by coupling bitlines to a sense amplifier/write circuit. It is contemplated that such use of the terms rows and columns is consistent with the general understanding in the art.

In the circuit of FIG. 1 the memory array 1 contains 18 memory cells arranged in 3 rows and 6 columns. Each cell on the first row is coupled to a first wordline 5, each cell on the second row is coupled to a second wordline 6 and each cell on the third row is coupled to a third wordline 7. The three cells in each column are coupled to a pair of complementary bitlines, a true bitline T and a complement bitline C.

All bitlines 18–29, true and complement, extend from the memory array 1 to the column decoder 9 inside the block 8. The column decoder 9 selects the appropriate true and complement bitlines from a plurality of bitlines 18–29 according to the logic signals COL0–COL5 present on its input 32 and connects the selected pair of bitlines, through its bi-directional connections 16 and 17, to read/write circuitry.

Output signals from the column decoder 9 are coupled to input terminals 33 and 34 of a sense amplifier 10. The output of the sense amplifier provide, on the dataOUT terminal 13, the output data bit from the memory cell addressed during a read operation. Output signals from the column decoder 9 are also coupled to outputs 35 and 36 of two write buffers 11 and 12 whose inputs receive, from the input terminals 14 and 15, the two complementary signals DataIN and DataIN_bar used during write operations to write a logic value in the memory cell currently addressed. The two write buffers 11 and 12 are controlled by a WRITE signal which enables a write cycle.

The column decoder topology typically involves mirroring and/or flipping of part of the pairs of true and complement bitlines because of design and layout constraints. A typical sequence of bitlines, which simplifies architecture of the column decoder in shown in FIG. 1. As can be seen, the first and the second columns of memory cells have the true bitline T on the left and the complement bitline C on the right, but the bitlines in the third and the fourth columns are flipped and have the complement bitline C on the left and the true bitline T on the right. The fifth and the sixth columns have again the bitlines in the same order of the first and the second, with the true bitline T on the left and the complement bitline C on the right.

Generally, in memory devices where one array contains thousands or even millions of memory cells, the sequence of the bitlines reflects this regularly mirroring of part of the bitlines. For example the sequence can alternate a certain number N of columns in which the bitlines are "normal" with a certain number M of columns in which the bitlines are "flipped". The two integer numbers N and M can be equal or different depending on the particular design and layout rules used during designing of the column decoder circuitry.

The sequence of the bitlines of the example of FIG. 1 is shown in the following table:

| Bitlines | T-C | T-C | C-T | C-T | T-C | T-C |
|---|---|---|---|---|---|---|
| Column | 1 | 2 | 3 | 4 | 5 | 6 |

As can be seen, the bitlines true and complement are not always alternate but sometimes a true bitline is next to another true bitline, like between columns 2 and 3, and a complement bitline is next to another complement bitline, like between columns 4 and 5 (although schematically, sometimes they may shown in a true alternating fashion, but it is not representative of the actual layout).

During particular stress tests an elevated voltage is applied to the integrated circuit and all cells in the memory array are simultaneously selected with the precise intent of stressing weak oxides inside memory cells and between adjacent bitlines. During these stress tests all cells are written simultaneously with logic "zeroes" or with logic "ones". In both cases, for each column in the array, when a true bitline is high the correspondent complement bitline is low, and, on the contrary, when a true bitline is low the correspondent complement bitline is high. This condition, together with the elevated voltage applied to the circuit, perform a voltage stress of all transistors inside each memory cell and of weak oxides between bitlines of the same column. Adjacent complementary bitlines of different columns are also stressed in the same time and in the same way. An evident negative consequence of the particular sequence of bitlines used in this array is that, when two bitlines of the same type, true or complement, are adjacent, the zone present between these bitlines and associated sides of adjacent memory cells are not stressed. An example of these zones is shown in FIG. 1, as zone 30 between second and third column or zone 31 between fourth and sixth column.

In earliest high density integrated memory circuits the signal to noise ratio (S/N) of the bitlines degrades for the long lines in large arrays and for the different capacitances of true and complement bitlines and the layout pitch becomes too small for implementation of complex sense amplifiers and decoders. A known solution in order to balance the different capacitances of true and complement bitlines is to insert one or more twist points in each column so that, in that point, bitlines true and complement are exchanged. Known twisted bitline schemes are the simple twisted bitline in which only one twist point is found in the middle of each column of the memory array and multiple twisted bitline in which more than one twist point is found in each column.

An example of a semiconductor memory in which is implemented a cross-coupled scheme of complementary bitlines is described in U.S. Pat. No. 4,980,860 entitled Cross-coupled complementary bit lines for a semiconductor memory with pull-up circuitry, assigned to Texas Instruments Inc. and incorporated herein by this reference. A criss-crossed complementary bit line and a cross-coupled pull-up means is disclosed. One bit line is crossed with respect to another bit line of a complementary bit line pair to reduce the effect of noise interference induced therein.

Therefore, it would be desirable to provide an architecture for integrated memory circuits that permits to perform a complete stress test of all the weak oxides inside the memory array.

In light of the above, it is an object of the present invention to provide an innovative architecture for an integrated memory device that permits a better voltage stress test simultaneously on the entire memory array.

SUMMARY OF THE INVENTION

An integrated circuit having a memory array comprised of a plurality of memory cells arranged in rows and columns and a logic circuitry including column decoder and read/write circuitry, wherein each column includes a plurality of memory cells connected in parallel by way of a pair of true and complement bitlines extending from the memory array to the logic circuitry. In order to perform a complete voltage stress test of the memory array, inside the array true and complement bitlines are alternated so that every true bitline is adjacent exclusively to complement bitlines and every complement bitline is adjacent exclusively to true bitlines. According to a first embodiment, bitlines exiting from the memory array are connected directly to the logic circuitry, while according to a second embodiment, between the array and the logic circuitry, at least one pair of true and complement bitlines is twisted so that one bitline cross over the other. As a result, inside the memory array the true bitline of said at least one pair is adjacent exclusively to complement bitlines and the complement bitline of said at least one pair is adjacent exclusively to true bitlines.

The characteristics and advantages of the circuit in accordance with the present invention are set forth in the description of an embodiment thereof given below by way of non-limiting example with reference to the annexed drawings.

DETAILED DESCRIPTION OF THE PREFERRED EMBODIMENT

Figure 2:
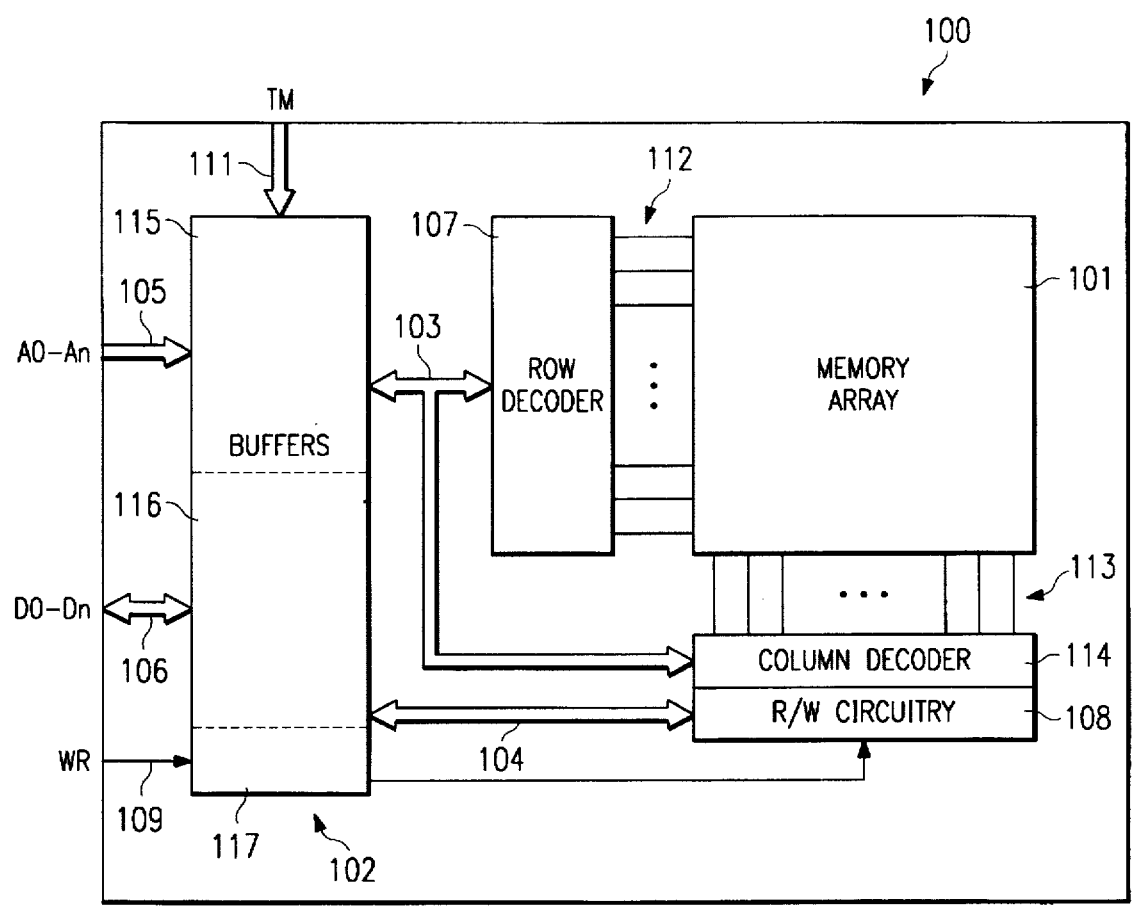
FIG. 2 is a schematic diagram of an integrated memory device.

FIG. 2 illustrates an example of an integrated memory circuit 100, in particular a static random access memory (SRAM), having its memory cells in memory array 101. Memory cells in memory array 101 are arranged in rows and columns (not shown).

Memory cells are selected by row and column decoders 107 and 114. These decoders are controlled by an internal address bus 103 exiting from address buffer 115. The address buffer 115 receives on its input the external address bus 105 on which are present the address signals A0-An. Data buffer 116 is used, during read and write cycles, to transfer data to and from the memory array through the data bus 104 and data bus 106 which connects the data buffer 116 to the read/write circuitry. The logic signal "write enable" WR pass through the buffer 117 and reaches the read/write circuitry 108. All these buffers 115, 116 and 117, indicated globally by the reference 102 in the figure, are controlled by a set of external signals TM applied to input bus 111. From these signals it is possible, during testing of the integrated circuit, to enter special test operation modes and to force the outputs of buffers 102 to predetermined logic values. By applying different logic signals to the input terminals TM it is possible, for example, to select all row and column decoders, and to contemporaneously write predetermined data into the whole array of memory cells.

A circuit that allows for the simultaneous selection or deselection of a plurality of rows and columns within a memory array is described in U.S. Pat. No. 5,339,277 entitled Address Buffer, assigned to SGS THOMSON Microelectronics, Inc. The operation mode of the buffer is controlled by external input terminals. A first and a second circuit generate a true and a complementary signal, respectively, during normal operations of the integrated circuit. When desired, the first and second circuits may be used to generate two signals of the same voltage level. The two signals of the same voltage level may then be used by an address decoder to simultaneously select or deselect a plurality of rows and/or columns within a memory array.

Address, data and signal buffers that allow for the simultaneous selection of a plurality of rows and columns within a memory array and contemporaneously perform a data write in the memory array with a predetermined logic value are described in co-pending U.S. patent application Ser. No. 476,658, entitled Reduced pin count stress test circuit for integrated memory devices and method therefor, filed Jun. 7, 1995, assigned to SGS THOMSON Microelectronics., Inc. A logic circuit, driven by a set of external test mode input signals, is used to force output terminals of a buffer to predetermined values depending from the test mode selected. The number of test mode input signals depends from the number of operation modes desired. Normally is present a normal operation mode plus three different test modes, first for selecting all rows and columns in the memory array and write all "ones" in memory cells, a second test mode for selecting all rows and columns in the memory array and write all "zeroes" in memory cells and a third for deselecting all rows and columns. Cycling these three test operation modes, while applying a stress voltage to the integrated circuit and eventually heating up the device to an elevated temperature, is possible to perform a complete stress test of the device in very short times. In fact during writing of all memory cells inside the array the stress voltage is applied between the true and the complement bitline of each column in the array and the weak oxides present between bitlines are stress tested in all array contemporaneously.

Figure 3:
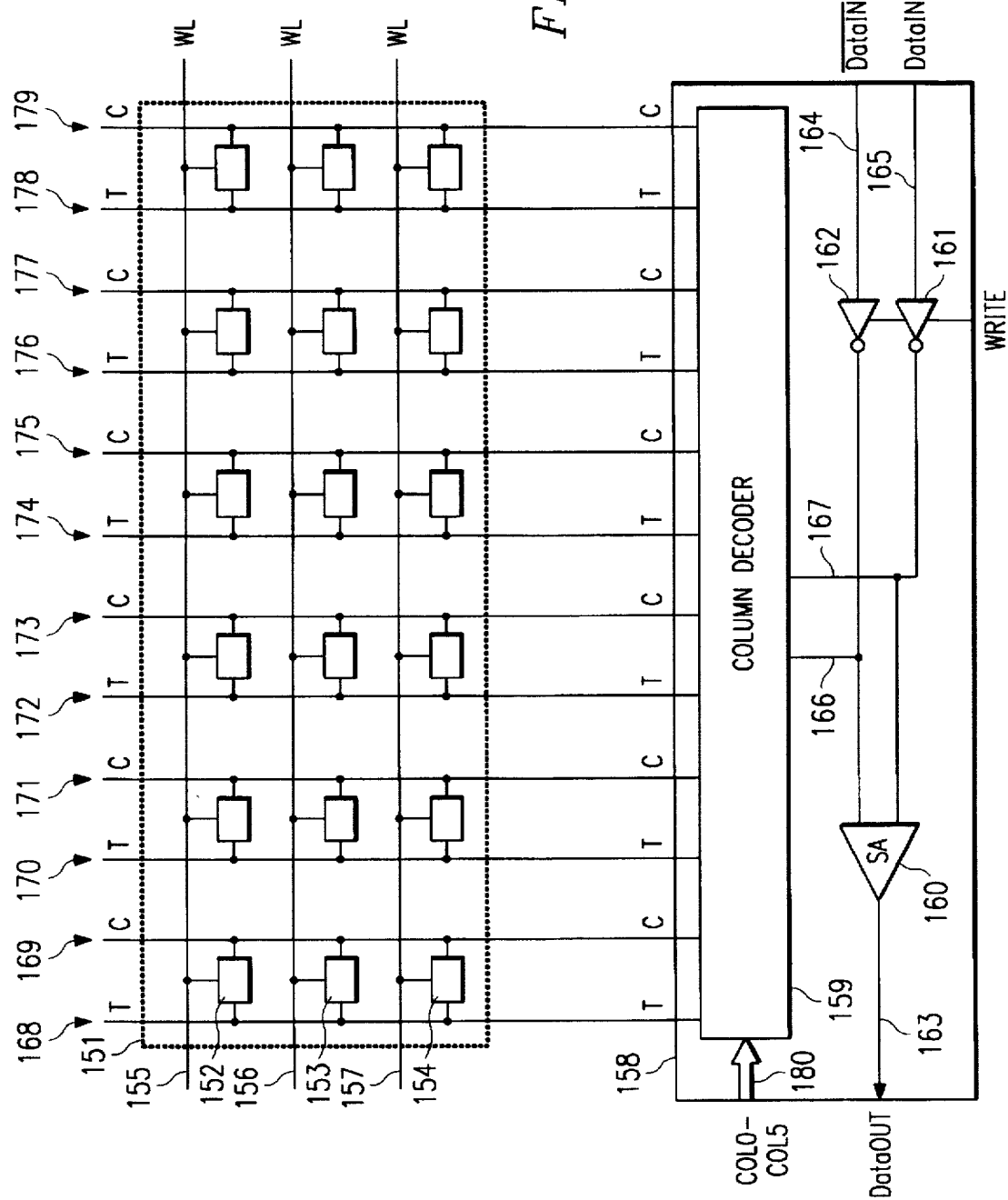
FIG. 3 is a block diagram of a first embodiment of part of an integrated memory circuit as modified to practice the invention.

In order to perform a complete voltage stress of all weak oxides inside the memory array, the bitline configuration shown in the circuit diagram of FIG. 3 can be used.

FIG. 3 illustrates a first embodiment, according to the present invention, of part of a static random access memory (SRAM) circuit, having its memory cells in the memory array 151. That is, all of the memory cells in the array 151 are located on one side of the boundary area, i.e., boundary region, that is located between the memory array 151 and the column decoder 159. In particular, the memory array 151 is connected, through a plurality of bitlines 168-179, to a circuit block 158 containing column decoder 159 and read/write circuitry and adjacent memory cells.

The boundary region is arbitrarily positioned such that the column decoder 159 is on one side of the boundary region and all portions of the memory array 151 are on the other side of the boundary region. That is, no portion of the memory array 151 is on the same side of the boundary region as the column decoder 159.

The memory array 151 contains 18 memory cells arranged in 3 rows and 6 columns. Each cell on the first row is coupled to a first wordline 155, each cell on the second row is coupled to a second wordline 156 and each cell on the third row is coupled to a third wordline 157. The three cells in each column are coupled to a pair of complementary bitlines, a true bitline T and a complement bitline C.

All bitlines 168-179, true and complement, extend from the memory array 151 to the column decoder 159 inside the block 158. The column decoder 159 selects the appropriate true and complement bitlines from a plurality of bitlines 168-179 according to the logic signals COL0-COL5 present on its input 180 and connects the selected pair of bitlines, through its bi-directional connections 166 and 167, to read/write circuitry.

The sequence of the bitlines true and complement inside the memory array 151 and on the side connected with the column decoders, is an alternating of true and complement bitlines.

This sequence optimizes the memory circuit for a parallel full voltage stress test of all bitlines and associated sides of adjacent memory cells in the memory array. In this way, during stress tests in which all cells are written simultaneously with logic "zeroes" or with logic "ones", when one bitline, for example a true bitline, is high the two adjacent bitlines are always low because are complement bitlines. This condition, together with the elevated voltage applied to the circuit, perform a voltage stress of all transistors inside each memory cell and of weak oxides between bitlines.

This architecture is useful with array of memory cells in which bitline twist points are not present inside the memory array or when a single bitline twist point is present in every column. In fact, in order to balance the different capacitances of true and complement bitlines, it sometimes is necessary to insert a bitline twist point in the middle point of each column, in which the bitlines true and complement are exchanged. In spite of the presence of these twist points, inside the memory array every true bitline is still adjacent only to complement bitlines and every complement bitline is adjacent only to true bitlines. This allows a full voltage stress test of the entire memory array as well as in memory arrays in which bitline twist points are not present.

On the contrary, using such architecture for the memory array, it is not possible to simplify and optimize the column decoder for minimum area, as is conventional done.

Figure 4:
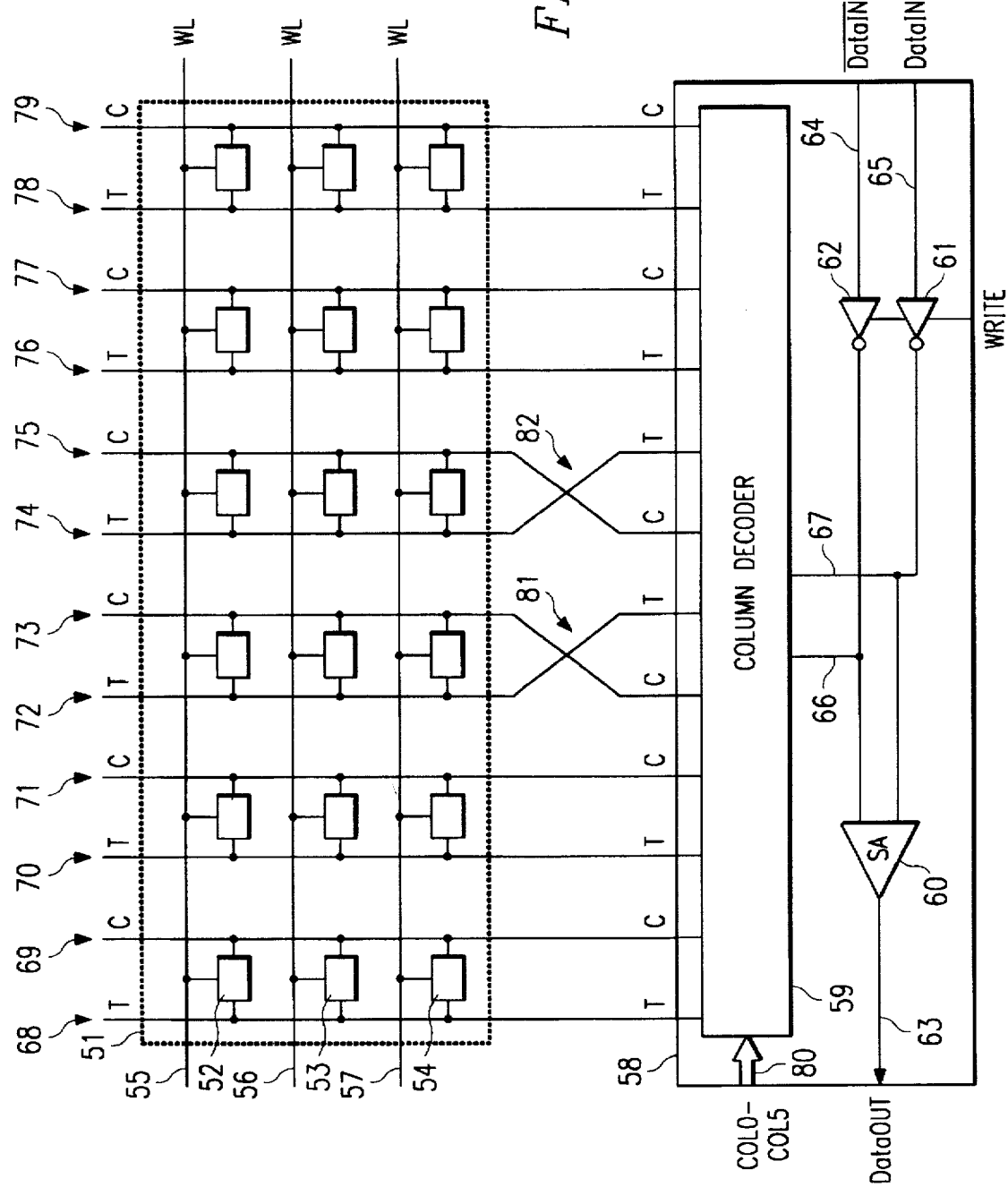
FIG. 4 is a block diagram of a second embodiment of part of an integrated memory circuit as modified to practice the invention.

In order to perform a complete voltage stress of all weak oxides inside the memory array and to also allow an optimization of the column decoder circuitry, the bitline configuration shown in the circuit diagram of FIG. 4 can be used.

FIG. 4 illustrates part of a static random access memory (SRAM) circuit, having its memory cells in the memory array 51. That is, all of the memeory cells in the array 51 are located on the same side of the boundary region that is between the array 51 and the column decoder 59. The boundary region of FIG. 4 is similar to that described in conjuction with FIG. 3. In particular, the memory array 51 is connected, through a plurality of bitlines 68–79, to a circuit block 58 containing column decoder 59 and read/write circuitry.

The memory array 51 contains 18 memory cells arranged in 3 rows and 6 columns. Each cell on the first row is coupled to a first wordline 55, each cell on the second row is coupled to a second wordline 56 and each cell on the third row is coupled to a third wordline 57. The three cells in each column are coupled to a pair of complementary bitlines, a true bitline T and a complement bitline C.

All bitlines 68–79, true and complement, extends from the memory array 51 to the column decoder 59 inside the block 58. The column decoder 59 selects the appropriate true and complement bitlines from a plurality of bitlines 68–79 according to the logic signals COL0–COL5 present on its input 80 and connects the selected pair of bitlines, through its bi-directional connections 66 and 67, to read/write circuitry.

Figure 1:
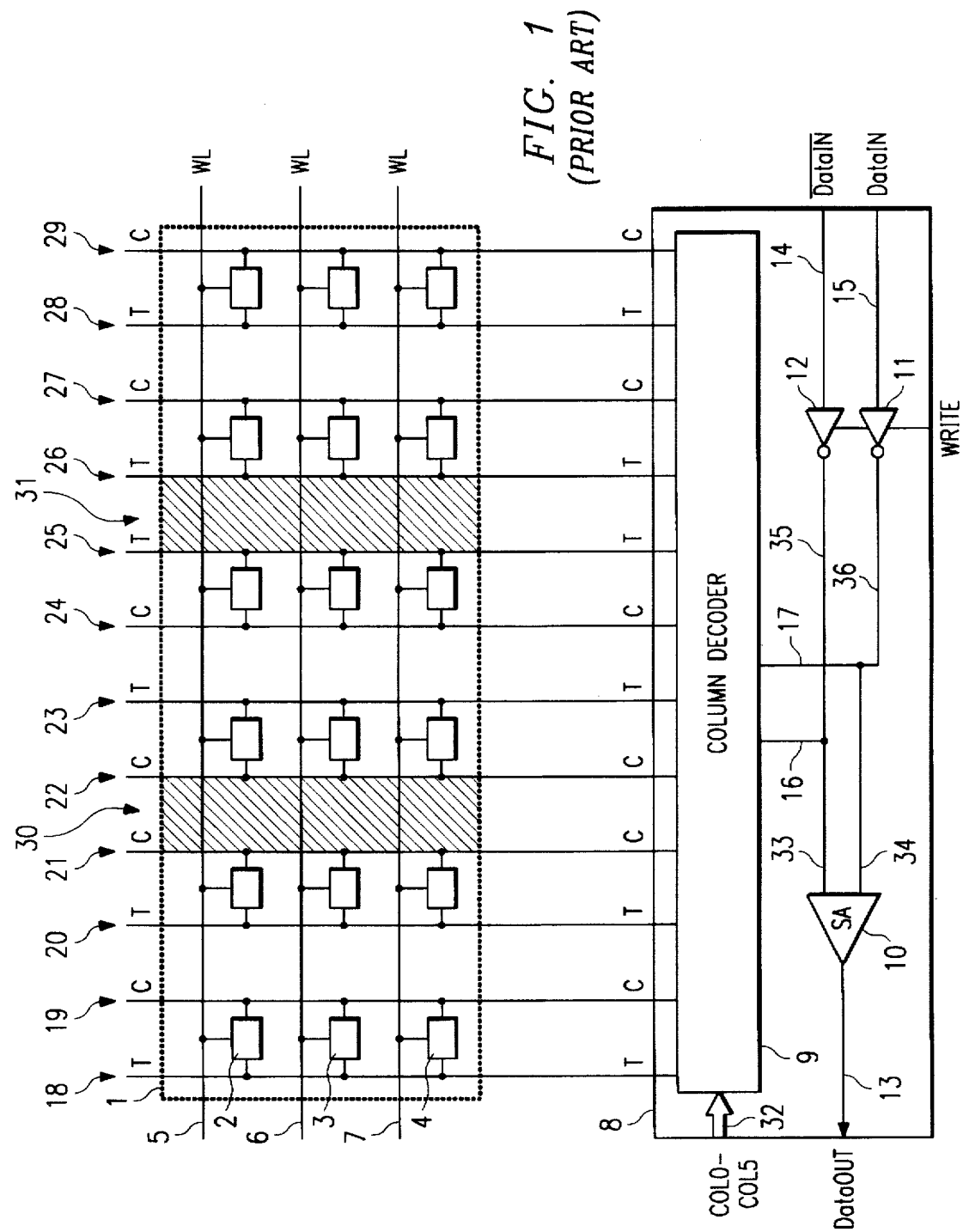
FIG. 1 is a block diagram of part of a prior art integrated memory circuit.

As in the example of FIG. 1, the sequence of the bitlines true and complement connected with the column decoder is not a simple alternating of true and complement but involves mirroring and/or flipping of part of the pairs bitlines. This is dictated by the design and layout constraints. The innovative difference of this circuit from the circuit of FIG. 1 is that in the columns in which the true and complement bitlines are mirrored, on the side connected with the column decoder, like in bitlines 72–73 and 74–75, is present a cross (81, 82) in which one bitline crosses over the other prior to entering the memory array. That is, the cross-over points 81 and 82 are within the boundary region between the array 51 and the column decoder 59.

For example, in an array where bitlines are metal lines and normally run in metal-1 layer, a bitline in metal-1 crossover in metal-2 the other bitline and then returns in metal-1 layer.

In this way can be present two different sequences of bitlines, one on the side of the column decoder optimized for the design of the decoder itself and another sequence on the side of the memory array optimized for a full voltage stress test of the entire memory array.

The sequences of the bitlines of the example of FIG. 4 are shown in the following table:

| Mem. Array Column | T-C<br>1 | T-C<br>2 | T-C<br>3 | T-C<br>4 | T-C<br>5 | T-C<br>6 |
|---|---|---|---|---|---|---|
| Column Dec. | T-C | T-C | C-T | C-T | T-C | T-C |

As can be seen, the bitlines true and complement are always alternate on the memory array side but maintain a different particular sequence on the column decoder side. This allows stressing of all bitlines to adjacent bitlines and all memory cells to adjacent memory cells.

This architecture is useful with array of memory cells in which are not present bitline twist points inside the memory array or when is present a single bitline twist point in every column. In fact, in order to balance the different capacitances of true and complement bitlines, sometimes is necessary to insert in the middle point of each column, a bitline twist point in which the bitlines true and complement are exchanged. In spite of the presence of these twist points, inside the memory array every true bitline is still adjacent only to complement bitlines and every complement bitline is adjacent only to true bitlines. This allows a full voltage stress test of the entire memory array as well as in memory arrays in which are not present bitline twist points.

A method for stress testing an integrated memory circuit that incorporates the above described bitline architecture will now be described. According to the preferred embodiment of the invention, one stress test cycle consists of three test phases, each test phase defined by the combination of test mode control signals applied to input bus 111 in FIG. 2, which in this case contains two input signals TM0 and TM1. With two input signals we can select four different operation modes, one normal operation mode and three special test operation modes explained above and shown in the following table:

| TM0 | TM1 | Status |
|---|---|---|
| 0 | 1 | First Test Mode (Write all 0's in memory) |
| 1 | 0 | Second Test Mode (Write all 1's in memory) |
| 1 | 1 | Third Test Mode (deselect all memory array) |

The first phase of the test starts by powering up the integrated memory circuit to a stress voltage, e.g. 7 Volt, which is higher than the normal operation voltage of the device. This power up is done while the first test mode control signal TM0 is maintained low and the second test mode control signal TM1 is maintained high. This combination of test mode control signals forces all outputs of address buffers high to select of all rows and columns in the array of memory cells, forces all outputs of data buffers low, and forces outputs of the signal buffer for signal "write enable" low. This situation causes a parallel writing of all memory cells in the array with logic "zeroes". During this first step the bitline loads are disabled.

The next step is to heat up the integrated memory circuit to a high temperature, e.g. 200°–250° C. and to pause for a certain amount of time, seconds up to several minutes. This stress condition allows test for ionic contamination or charge trap sites. This is allowed by the greater mobility of ions at high temperatures and their tendency to drift (or be attracted) based on an electric field.

Then, the device is cooled down and, exited test mode, is exercised by writing and reading each memory cell individually, or by bytes or words, to identify any and all failures in the memory array. If this verify step fails, the device is discarded (or indicated as a failure when in wafer form) and the stress test ends. If, otherwise, the verify step is passed, the device is powered down, ending the first phase of the stress test.

The second phase of the stress test starts by again powering up the integrated memory circuit to the same stress voltage while the first test mode control signal TM0 is maintained high and the second test mode control signal TM1 is maintained low. This combination of test mode control signals forces all outputs of address buffers high to select all rows and columns in the array of memory cells, forces all outputs of data buffers high, and forces outputs of the signal buffer for signal "write enable" low. During this first step the bitline loads are disabled.

The next step is to heat up the integrated memory circuit to a high temperature, e.g. 200°–250° C. and to pause for a certain amount of time, seconds up to several minutes. This stress condition allows test for ionic contamination or charge trap sites. This is allowed by the greater mobility of ions at high temperatures and their tendency to drift (or be attracted) based on an electric field.

Then, the device is cooled down and, exited test mode, is exercised by writing and reading each memory cell individually, or by bytes or words, to determining if any of the memory cells in the array are now failures. If this verify step fails, the device is identified as a failure and the stress test ends. If, otherwise, the verify step is passed, the device is powered down ending the second phase of the stress test.

The third and last phase of the stress test starts by again powering up the integrated memory circuit to the same stress voltage, while the first and the second test mode control signals TM0 and TM1 are maintained high. This combination of test mode control signals forces all outputs of address buffers low to deselect of all rows and columns in the array of memory cells, forces all outputs of data buffers low, and forces output of the signal buffer for signal "write enable" high. In this situation all rows and columns are deselected and writing is disabled.

Next step is to heat up the integrated memory circuit to a high temperature, i.e. 200°–250° C. and to pause for a certain amount of time, seconds up to several minutes. This stress condition allows test for ionic contamination or charge trap sites. This is allowed by the greater mobility of ions at high temperatures and their tendency to drift (or be attracted) based on an electric field.

Then the device is cooled down and exited test mode, is exercised by writing and reading each memory cell individually, or by bytes or words, to determine if any portion of the memory is now inoperable. If this verify step fails the device is identified as a failure and the stress test ends. If, otherwise, the verify step is passed, the device is powered down, ending the stress test.

In order to enhance oxide stressing, it is possible to perform an additional oxide stress step, after the steps of cooling down the device and before exiting the test mode and exercising memory cells individually. This step can be performed in all three described phases, or only in one or two of them, performed by cooling the device to a medium temperature, for example 80° C., raising the supply voltage to a higher stress voltage, for example 9 Volts, and maintaining these conditions for a limited time, for example one second. This step is believed to improve the stress of all oxides in the integrated circuit.

The above described method for stress testing integrated memory circuits, together with the above described buffer circuits, provides a method for detecting latent defects within the memory array as well as within decoders and periphery circuits. DC conditions of the test, compared to traditional dynamic testing at elevated temperature, reduce latchup phenomena and allows test for ionic contamination or charge trap sites. This is allowed by the greater mobility of ions at high temperatures and their tendency to drift (or be attracted) based on a constant electric field.

Furthermore, the stress test described above saves time because it performs, at wafer level, a complete stress test that would otherwise be done in a burn in of packaged devices. All of the stress test can be performed in less than several minutes, or even few seconds, instead of the several hours (such as 96 hours for a 1 Megabyte SRAM) necessary for a conventional burn in test. Finally, the test equipment is also simplified because, during the test, the integrated memory device is controlled by only four pads, two for power supply and two for controlling different test operation modes. This extremely reduced number of pads for each die, controlled during the test, allows, with ordinary test stations, exercising multiple die in parallel without affecting complexity of test equipment or duration of test.

Although the method has been described by applying the three phases in such order, writing all zeroes in the memory array, writing all ones in the memory array and then deselect all memory array, other combination or subsets of the three test phases may be used. For example the sequencing of the test phase may be altered as follows, first deselect all memory array and then write into the memory array all zeroes and then all ones or skip the phase of deselecting all memory array.

In addition, the stress time, the stress voltage applied to the integrated circuit and the temperature are related parameters, and they can vary between certain limits. For example longer time at higher voltage may allow reduced temperature or higher voltage at higher temperature may allow reduced time.

Finally, the verification processes may all be done at the end of all three test phases, so that these three phases can be done on the same simple test station. Indeed the verification process has to be done on a different tester station that permits to read and write single cells, or bytes or words, in the memory array, controlling any address and data signals in normal operation mode.

In other words the method described above may be changed to meet the needs of the user.

While the invention has been particularly shown and described with reference to a preferred embodiment, it will be understood by those skilled in the art that various changes in form and detail may be made therein without departing from the spirit and scope of the invention.

I claim:

1. An integrated circuit comprising:
   a memory array having a plurality of memory cells arranged in rows and columns;
   a column decoder having column terminals and bidirectional read/write terminals;
   a boundary area located between said memory array and said column decoder such that none of the memory cells that are located within said memory array are located on the same side of said boundary area as said column decoder,
   wherein each column includes a plurality of memory cells connected in parallel by way of a pair of true and complement bitlines that extend out from the memory array and that are coupled to the column terminals of the column decoder, at least one pair of said bitlines crossing over one another within said boundary area; and
   wherein, inside the memory array, the true bitline of each pair is adjacent exclusively to a complement bitline of another pair of true and complement bitlines and the complement bitline of said each pair is adjacent exclusively to a true bitline of another pair of true and complement bitlines, the true and complement bit lines being so exclusively adjacent to one another along the entire lengths of the respective bitline portions that are inside the memory array.

2. The integrated circuit of claim 1 further comprising read/write circuitry coupled to the read/write terminals of said column decoder.

3. The integrated circuit of claim 2, having a normal operation mode and at least one special test operation mode, further comprising:
   row decoder circuitry;
   address, data and control signal buffers used to generate control signals for the row decoder circuitry and for the logic circuitry;
   wherein said address, data and control signal buffers have at least one test mode control input for receiving a mode select code and, during the at least one special test operation mode, generate on their outputs predetermined logic signals responsive to said at least one test mode control input receiving a mode select code indicating one special test operation mode.

4. The integrated circuit of claim 3 wherein said address, data and control signal buffers, during the at least one special test operation mode, generate on their outputs predetermined logic signals so that all row and column decoders are selected and all cells in the memory array are written with logic ones.

5. The integrated circuit of claim 3 wherein said address, data and control signal buffers, during the at least one special test operation mode, generate on their outputs predetermined logic signals so that all row and column decoders are selected and all cells in the memory array are written with logic zeroes.

6. The integrated circuit of claim 3 wherein said address, data and control signal buffers, during the at least one special test operation mode, generate on their outputs predetermined logic signals so that all row and column decoders are unselected.

7. The integrated circuit of claim 1 wherein inside the memory array all pairs of true and complement bitlines cross over one another.

8. An integrated circuit comprising:

a memory array including a plurality of memory cells arranged in rows and columns;

a column decoder having bitline terminals and bidirectional data terminals;

a boundary region positioned between the memory array and the column decoder such that no portion of the memory array is located on the same side of the boundary region as the column decoder, wherein each column includes a plurality of memory cells connected in parallel by way of a pair of true and complement bitlines extending out from the memory array to the bitline terminals of the column decoder; and wherein, at a location within the boundary region, a pair of true and complement bitlines is twisted so that one bitline crosses over the other, and so that inside the memory array, the true bitline of said pair is adjacent exclusively to a complement bitline of another pair of true and complement bitlines and the complement bitline of said pair is adjacent exclusively to a true bitline of another pair of true and complement bitlines, such a true-complement bitline pattern being implemented for the full lengths of the respective bitline portions that are located within the array.

9. The integrated circuit of claim 8 wherein within the boundary region, a plurality of pairs of true and complement bitlines are twisted to allow a desired layout of the column decoder and so that, inside the memory array, each complement bitline is adjacent exclusively to true bitlines and each true bitline is adjacent exclusively to complement bitlines.

10. The integrated circuit of claim 8 further comprising read/write circuitry coupled to the bidirectional data terminals of said column decoder.

11. The integrated circuit of claim 10, having a normal operation mode and at least one special test operation mode, further comprising:

row decoder circuitry;

address, data and control signal buffers used to generate control signals for the row decoder circuitry and for the logic circuitry;

wherein said address, data and control signal buffers have at least one test mode control input for receiving a mode select code and, during the at least one special test operation mode, generate on their outputs predetermined logic signals responsive to said at least one test mode control input receiving a mode select code indicating one special test operation mode.

12. The integrated circuit of claim 11 wherein said address, data and control signal buffers, during the at least one special test operation mode, generate on their outputs predetermined logic signals so that all row and column decoders are selected and all cells in the memory array are written with logic ones.

13. The integrated circuit of claim 11 wherein said address, data and control signal buffers, during the at least one special test operation mode, generate on their outputs predetermined logic signals so that all row and column decoders are selected and all cells in the memory array are written with logic zeroes.

14. The integrated circuit of claim 11 wherein said address, data and control signal buffers, during the at least one special test operation mode, generate on their outputs predetermined logic signals so that all row and column decoders are unselected.

15. The integrated circuit of claim 8 wherein inside the memory array all pairs of true and complement bitlines are twisted to cross over one another.

16. A method for stress testing an integrated memory circuit including a memory array having a plurality of memory cells arranged in rows and columns, a first logic circuitry including column decoder circuitry, a boundary region that extends between the memory array and the column decoder circuitry such that no portion of the memory array is located on a side of the boundary region where the column decoder circuitry is located, and a second logic circuitry coupled to the memory array and including row decoder circuitry, wherein each column includes a plurality of memory cells connected in parallel by way of a pair of true and complement bitlines that couple the memory array to the first logic circuitry, wherein, inside the memory array, the true bitline of each pair is adjacent exclusively to a complement bitline of another pair of true and complement bitlines along the full length of the true-bitline section that is within the array, and the complement bitline of said each pair is adjacent exclusively to a true bitline of another pair of true and complement bitlines along the full length of the complement-bitline section that is within the array, and wherein outside the memory array and within the boundary region one or more pairs of said bitlines are twisted, the method comprising the steps of:

simultaneously setting a plurality of inputs of the column decoder circuitry to a first common voltage level and a plurality of inputs of the row decoder circuitry to a second common voltage level; and applying a stress voltage to the memory array for a predetermined time period to stress isolation regions that are located between adjacent bitlines.

17. The method of claim 16 wherein inside the array all pairs of true and complement bitlines cross over one another.

18. The method of claim 16 wherein the first common voltage applied to a plurality of inputs of the column decoder circuitry selects all columns in the memory array and the second common voltage applied to a plurality of inputs of the row decoder circuitry selects all rows in the memory array.

19. The method of claim 16 wherein the first common voltage applied to a plurality of inputs of the column decoder circuitry unselects all columns in the memory array and the second common voltage applied to a plurality of inputs of the row decoder circuitry unselects all rows in the memory array.

20. The method of claim 16 wherein the step of applying a stress voltage comprises the steps of:

setting a plurality of true bitlines to a low voltage while a plurality of complement bitlines are set to a high voltage; and setting a plurality of true bitlines to a high voltage while a plurality of complement bitlines are set to a low voltage for a predetermined time period.

* * * * *